US007985723B2

(12) United States Patent
Savu et al.

(10) Patent No.: US 7,985,723 B2
(45) Date of Patent: Jul. 26, 2011

(54) FLUORINATED SULFONAMIDE SURFACTANTS FOR AQUEOUS CLEANING SOLUTIONS

(75) Inventors: Patricia M. Savu, Maplewood, MN (US); William M. Lamanna, Stillwater, MN (US); Michael J. Parent, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/871,275

(22) Filed: Aug. 30, 2010

(65) Prior Publication Data

US 2010/0320416 A1 Dec. 23, 2010

Related U.S. Application Data

(62) Division of application No. 11/866,671, filed on Oct. 3, 2007, now Pat. No. 7,811,978, which is a division of application No. 10/792,456, filed on Mar. 3, 2004, now Pat. No. 7,294,610.

(51) Int. Cl.
*H01L 21/02* (2006.01)

(52) U.S. Cl. ........................ 510/175; 510/176; 252/79.1

(58) Field of Classification Search .................. 510/175, 510/176; 252/79.1
See application file for complete search history.

(56) References Cited

U.S. PATENT DOCUMENTS

| | | | | |
|---|---|---|---|---|
| 2,803,615 | A | 8/1957 | Ahlbrecht | |
| 2,803,656 | A | 8/1957 | Ahlbrecht | |
| 2,809,990 | A | 10/1957 | Brown | |
| 3,734,962 | A | 5/1973 | Niederprüm | |
| 3,970,586 | A * | 7/1976 | Schliebs et al. | 516/199 |
| 4,370,254 | A | 1/1983 | Mitschke et al. | |
| 5,227,493 | A * | 7/1993 | Banks | 546/307 |
| 5,466,389 | A | 11/1995 | Ilardi et al. | |
| 5,624,541 | A | 4/1997 | Pohmer et al. | |
| 5,688,884 | A | 11/1997 | Baker et al. | |
| 6,376,452 | B1 | 4/2002 | Flynn et al. | |
| 6,664,354 | B2 | 12/2003 | Savu et al. | |
| 6,753,380 | B2 | 6/2004 | Qiu | |
| 6,858,124 | B2 | 2/2005 | Zazzera et al. | |
| 6,890,452 | B2 * | 5/2005 | Parent et al. | 252/79.1 |
| 7,101,492 | B2 * | 9/2006 | Parent et al. | 252/79.1 |
| 7,169,323 | B2 * | 1/2007 | Parent et al. | 252/79.1 |
| 7,294,610 | B2 * | 11/2007 | Savu et al. | 510/175 |
| 7,811,978 | B2 * | 10/2010 | Savu et al. | 510/175 |
| 2003/0001130 | A1 | 1/2003 | Qiu | |
| 2004/0089840 | A1 * | 5/2004 | Parent et al. | 252/79.1 |
| 2004/0094510 | A1 * | 5/2004 | Parent et al. | 216/83 |
| 2005/0181620 | A1 * | 8/2005 | Parent et al. | 438/745 |
| 2005/0197273 | A1 * | 9/2005 | Savu et al. | 510/412 |
| 2008/0078747 | A1 * | 4/2008 | Savu et al. | 216/99 |
| 2010/0320416 | A1 * | 12/2010 | Savu et al. | 252/79.3 |

FOREIGN PATENT DOCUMENTS

| | | |
|---|---|---|
| EP | 0073863 | 3/1983 |
| EP | 0416126 | 3/1991 |
| EP | 0561236 | 9/1993 |
| GB | 1599414 | 9/1981 |
| JP | 5275406 | 10/1993 |
| WO | WO 2004044092 | 5/2004 |

OTHER PUBLICATIONS

Fluorinated Surfactants, "Liquid-Vapor and Liquid-Liquid Boundaries," editor Erik Kissa, Marcel Dekker, Inc., New York, 1994, p. 119.

Zazzera et al., "XPS and SIMS Study of Anhydrous HF and UV/Ozone-Modified Silicon (100) Surfaces," Journal of the Electrochemical Society, vol. 136, No. 2, pp. 484-491, Feb. 1989.

Kikuyama, et al., IEEE Transactions on Semiconductor Manufacturing, vol. 3, No. 3, Aug. 1990, Surface Active Buffered Hydrogen Fluoride Having Excellent Wettability for ULSI Processing, pp. 99-108.

* cited by examiner

*Primary Examiner* — Gregory E Webb
(74) *Attorney, Agent, or Firm* — Kent S. Kokko

(57) ABSTRACT

Described are anionic N-substituted fluorinated sulfonamide surfactants, and use thereof in cleaning and in acid etch solutions. The cleaning and etch solutions are used with a wide variety of substrates, for example, in the cleaning and etching of silicon oxide-containing substrates.

21 Claims, No Drawings

FLUORINATED SULFONAMIDE SURFACTANTS FOR AQUEOUS CLEANING SOLUTIONS

CROSS REFERENCE TO RELATED APPLICATIONS

This application is a divisional of U.S. application Ser. No. 11/866,671, filed Oct. 3, 2007, now U.S. Pat. No. 7,811,978 now allowed, which is a divisional of U.S. application Ser. No. 10/792,456, filed Mar. 3, 2004, issued as U.S. Pat. No. 7,294,610, the disclosure of which is incorporated by reference in their entirety herein.

FIELD OF THE INVENTION

The present invention is directed to certain fluorinated sulfonamide surfactants, and use thereof in cleaning solutions, such as in aqueous buffered acid etch solutions. The etch solutions can be used with a wide variety of substrates, for example, in the etching of silicon oxide-containing substrates.

BACKGROUND

The use of microelectronic devices, such as integrated circuits, flat panel displays and microelectromechanical systems, has burgeoned in new business and consumer electronic equipment, such as personal computers, cellular phones, electronic calendars, personal digital assistants, and medical electronics. Such devices have also become an integral part of more established consumer products such as televisions, stereo components and automobiles.

These devices in turn contain one or more very high quality semiconductor chips containing many layers of circuit patterns. Typically nearly 350 processing steps are required to convert a bare silicon wafer surface to a semiconductor chip of sufficient complexity and quality to be used, for example, in high performance logic devices found in personal computers. The most common processing steps of semiconductor chip manufacture are wafer-cleaning steps, accounting for over 10% of the total processing steps. These cleaning steps are normally one of two types: oxidative and etch (or a combination of the two). During oxidative cleaning steps, oxidative compositions are used to oxidize the silicon or polysilicon surface, typically by contacting the wafer with aqueous peroxide or ozone solution. During etch cleaning steps, etching compositions are used to remove native and deposited silicon oxide films and organic contaminants from the silicon or polysilicon surface before gate oxidation or epitaxial deposition, typically by contacting the wafer with aqueous acid. See, for example, L. A. Zazzera and J. F. Moulder, *J. Electrochem. Soc,* 136, No. 2, 484 (1989). The ultimate performance of the resulting semiconductor chip will depend greatly on how well each cleaning step has been conducted.

In the development of cleaning semiconductor wafers, several chemistries have been explored, and a few remain as the industry standards. These industry standards are known as Standard Clean-1 (SC-1; also known as RCA-1) and Standard Clean-2 (SC-2; also known as RCA-2). SC-1 has an alkaline pH and contains ammonium hydroxide ($NH_4OH$), hydrogen peroxide ($H_2O_2$) and water. Typically, SC-1 is used in the first step to remove metal, ions and oxide surface organic materials. This procedure is then followed by application of SC-2, to remove heavy metals, alkalis and metal hydroxide contaminants. SC-2 has an acidic pH and contains hydrochloric acid, hydrogen peroxide and water. If a semiconductor wafer is heavily contaminated with organic material solutions of sulfuric acid ($H_2S)_4$) and hydrogen peroxide ($H_2O_2$) may be used. These solutions are called Piranha. (See Burkman et al., Handbook of Semiconductor Wafer Cleaning Technology, Chapter 3, Aqueous Cleaning Processes; 120-3). Other materials that have been used to clean wafer surfaces include aqueous solutions of HF, HBr, phosphoric acid, nitric acid, acetic acid, ozone, and mixtures thereof.

SUMMARY OF THE INVENTION

The present invention provides a composition which includes one or more fluorochemical surfactants derived from $C_2$-$C_6$ perfluoroalkane sulfonyl fluorides, and, in particular, perfluorobutane sulfonyl fluoride (PBSF), that contain an N-substituted alkyl side chain larger than methyl. These surfactants surprisingly lower the surface tension of water and other aqueous media to the same or similar low values achieved by the PBSF materials where the nitrogen is unsubstituted or methyl substituted. These compositions are useful in cleaning substrates including cleaning or polishing silicon or GaAs, silicon or GaAs wafers coated with thin films of various compositions including metals, conductive polymers, insulating materials, and also copper-containing substrates, such as for example, copper interconnects.

One aspect of the present invention includes a composition including: (a) at least 10 ppm, typically from about 10 to about 1000 ppm of at least one surfactant of the formula:

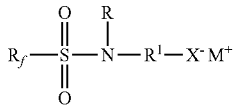

wherein: $R_f$ is a $C_2$ to $C_6$ perfluoroalkyl group; R is a $C_2$-$C_{25}$ alkyl, hydroxyalkyl, alkylamine oxide, or aminoalkyl group which is optionally interrupted by a catenary oxygen, nitrogen, or sulfur atom; $R^1$ is an alkylene group of the formula $—C_n—H_{2n}(CHOH)_oC_mH_{2m}—$, wherein n and m are independently 1 to 6, and o is 0 or 1, and where the alkylene is optionally interrupted by a catenary oxygen, nitrogen or sulfur atom; $X^-$ is $—SO_3^-$ or $—CO_2^-$; and $M^+$ is a cation; and (b) solvent; and (c) oxidizing agent.

The composition preferably employs water as a solvent. The composition may further include acid such as hydrochloric acid to make the media acidic or an alkaline material, for example, ammonium hydroxide, to make the medium basic.

A second aspect of the invention includes a method of cleaning a substrate comprising the steps of: (a) providing a composition as defined above; (b) providing a substrate comprising at least one surface, typically having at least one metal interconnect and/or film, the metal interconnect and/or film having at least one unwanted material on the surface; (c) bringing the surface of the substrate and the composition into contact with each other to form an interface; and (d) allowing removal of unwanted surface material.

Another embodiment of the present invention is an aqueous acid cleaning solution containing an acid; and a surfactant of the formula:

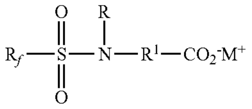

wherein: $R_f$ is a $C_2$ to $C_6$ perfluoroalkyl group; R is a $C_2$-$C_{25}$ alkyl, hydroxyalkyl or aminoalkyl group which is optionally interrupted by a catenary oxygen, nitrogen or sulfur atom; $R^1$ is an alkylene group of the formula $—C_nH_{2n}(CHOH)_oC_mH_{2m}—$, wherein n and m are independently 1 to 6, and o is 0 or 1, and where the alkylene is optionally interrupted by a catenary oxygen, nitrogen, or sulfur atom; $M^+$ is a cation.

Typically the acid is hydrogen fluoride and/or an onium fluoride complex, e.g., ammonium fluoride.

Still another embodiment of the present invention is an aqueous cleaning solution containing at least 10 parts per million (ppm) of a surfactant of the formula:

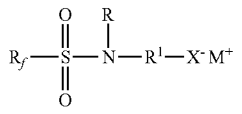

wherein $R_1$, R, $R^1$, $X^-$ and $M^+$ are as defined above, and wherein the solution has a pH of 7 or greater.

The fluorinated surfactant is sufficiently stable in the aqueous acid etch solution, and advantageously reduces the surface tension thereof so that nanoscale features may be effectively produced on a silicon substrate, such as an integrated circuit and is soluble in the aqueous acid etch solutions. The solution of the instant invention provides one or more of the following advantages: the solution has the same etch rate as conventional etch solutions, and possesses low surface tension. In addition it is non-foaming, low in particulates that may contaminate a substrate and leaves low or no surface residues on rinsing. It also offers improved stability of performance when filtered or after extended storage and finally affords excellent substrate surface smoothness. Other substrates, including metals and oxides may also be etched and cleaned by appropriate selection of acid or mixtures of acids.

In one aspect, this invention relates to an etch solution useful in semiconductor and integrated circuit manufacture, the composition including a fluorinated surfactant, hydrogen fluoride and onium fluoride complex thereof. Advantageously, the present invention provides an aqueous etch solution useful for etching, and removal of residues, that contains a relatively low concentration of surfactant, but effectively wets the substrate and has an efficient rate of etching.

In another aspect, this invention relates to an etch process for substrates by contacting a substrate with a homogeneous etch solution including the fluorinated surfactant and acid for a time sufficient to achieve a predetermined degree of etching. In a preferred embodiment, this invention relates to an etch process for substrates by contacting a substrate with a homogeneous etch solution including the fluorinated surfactant, HF and/or onium fluoride complex for a time sufficient to achieve a predetermined degree of etching. The present invention provides an etch solution with low surface tension that easily penetrates the intricate microstructures and wets the surfaces on silicon substrates.

DETAILED DESCRIPTION OF ILLUSTRATIVE EMBODIMENTS

The present invention relates to compositions used for cleaning substrates and also as etch solutions. The compositions for cleaning substrates include at least one fluorinated surfactant, a solvent and an oxidizing agent. The etch composition or solution is an aqueous solution containing an acid and at least one fluorinated surfactant.

Substrates useful in the present invention include silicon, germanium, GaAs, InP and other III-V and II-VI compound semiconductors. It will be understood, due to the large number of processing steps involved in integrated circuit manufacture, that the substrate may include layers of silicon, polysilicon, metals and oxides thereof, resists, masks and dielectrics. The present invention is also particularly useful in the etch and release of silicon-based microelectromechanical (MEMS) devices. The etch cleaning and drying of MEMS has similar issues to those for semiconductor chip manufacture. When the substrate is a copper interconnect, it is defined herein as a surface pattern containing copper. A film is defined herein as a thin coating of material on the substrate such as a silicon wafer, for example, a film of copper metal, silicon nitride, photoresist or a dielectric.

It is to be understood that the recitation of numerical ranges by endpoints includes all numbers and fractions subsumed within that range (e.g., 1 to 5 includes 1, 1.5, 2, 2.75, 3, 3.80, 4, and 5). It is to be understood that all numbers and fractions thereof are presumed to be modified by the term "about." It is to be understood that "a" as used herein includes both the singular and plural.

The term "alkyl" refers to straight or branched, cyclic or acyclic hydrocarbon radicals, such as methyl, ethyl, propyl, butyl, octyl, isopropyl, tert-butyl, sec-pentyl, and the like. Alkyl groups include, for example, 1 to 12 carbon atoms, 1 to 8 carbon atoms, or preferably 1 to 6 carbon atoms.

The term "perfluoroalkyl" refers to a fully fluorinated monovalent straight or branched, cyclic or acyclic, saturated hydrocarbon radical such as, for example, $CF_3CF_2—$, $CF_3CF_2CF_2—$, $CF_3CF_2CF_2CF_2—$, $(CF_3)_2CFCF_2CF_2—$, $CF_3CF(CF_2CF_3)CF_2CF_2—$, and the like. One or more non-adjacent $—CF_2—$ groups may be substituted with a catenary oxygen or nitrogen atom such as, for example, $CF_3CF_2OCF(CF_3)CF_2—$, and the like. Perfluoroalkyl groups include, for example, 2 to 6 carbon atoms, preferably 3 to 5 carbon atoms, and most preferably 4 carbon atoms.

Amide Salt Surfactants

The amide salts of the present invention can be represented by the following formula:

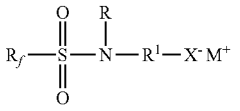

wherein: $R_f$ is a $C_2$ to $C_6$ perfluoroalkyl group; R is a $C_2$-$C_{25}$ alkyl, hydroxyalkyl, an alkylamine oxide or aminoalkyl group which is optionally interrupted by a catenary oxygen, nitrogen, or sulfur atom; $R^1$ is an alkylene group of the formula $—C_nH_{2n}(CHOH)_oC_mH_{2m}—$, wherein n and in are independently 1 to 6, and o is 0 or 1, and where the alkylene is optionally interrupted by a catenary oxygen, nitrogen, or sulfur atom; $X^-$ is $—SO_3^-$ or $—CO_2^-$, and $M^+$ is a cation.

The R group may be an alkyl, a hydroxyalkyl, an alkylamine oxide or an aminoalkyl group. In particular, R may be an alkyl group of the formula $—C_pH_{2p+1}$, a hydroxyalkyl group of the formula $—C_pH_{2p}—OH$, an alkylamine oxide of the formula $—C_pH_{2p}N^+R^2R^3O^-$, or an aminoalkyl group of the formula $—C_pH_{2p}—NR^2R^3$, where p is an integer of 1 to 6 and $R^2$ and $R^3$ are independently H or alkyl groups of one to six carbon atoms. The R group may further comprise a catenary oxygen, nitrogen, or sulfur atom, where a $—CH_2—$ group is replaced by a $—O—$ or $—NR^4—$ group wherein $R^4$ is an H—, or a $C_1$ to $C_6$ alkyl group. It is preferred that such catenary atoms are not alpha to a heteroatom, such as may found in the hydroxyalkyl or aminoalkyl groups of the R group.

$R^1$ is an alkylene group of the formula $—C_nH_{2n}(CHOH)_oC_mH_{2m}—$, wherein n and m are independently 1 to 6 and o is 0 or 1, and wherein the alkylene is optionally interrupted by a caternary oxygen, nitrogen, or sulfur atom as described above. $R^1$ is preferably $—C_nH_{2n}(CHOH)_oC_mH_{2m}—$ where n and m are independently 1 to 6.

$X^-$ is $—CO_2^-$ wherein the surfactant is used in an aqueous etch solution with an acid.

$M^+$ represents an inorganic or organic cation. Suitable inorganic cations include metal cations, including transition metal cations, and alkali- and alkali earth metal cations. Suitable organic cations include onium cations such as ammonium, including primary, secondary, tertiary and quaternary ammonium cations, sulfonium, and phosphonium cations. For many etching applications, such as in the preparing of semiconductors, metals may have a deleterious effect on the subsequent electronic performance of the devices and for this reason, ammonium, including primary, secondary, tertiary and quaternary ammonium cations are preferred.

$R_f$ is preferably a $C_3$ to $C_5$ perfluoroalkyl group and most preferably a $C_4$ perfluoroalkyl group.

Many previously known fluorinated surfactants contain perfluorooctyl moieties, such as the perfluoro octane sulfonate anion (PFOS). It has been reported that certain perfluorooctyl-containing compounds may tend to bio-accumulate in living organisms; this tendency has been cited as a potential concern regarding some fluorochemical compounds. For example, see U.S. Pat. No. 5,688,884. As a result, there is a desire for fluorine-containing surfactants which are effective in providing desired performance, and which eliminate more effectively from the body (including elimination of the composition and its degradation products).

It is expected that the surfactants of the present invention, which contain anions with relatively short perfluoro alkali segments (less than 8 perfluorinated carbon atoms) when exposed to biological, thermal, oxidated, hydrolytic, and photolytic conditions found in the environment, will break down to functional, short chain fluorocarbon degradation products that will not bio-accumulate. For example, compositions of the present invention containing a perfluorobutyl moiety, such as $CF_3CF_2CF_2CF_2—$ are expected to eliminate from the body much more effectively than perfluorooctyl. For this reason preferred embodiments of the $R_f$ group in the above formula include perfluoroalkyl groups $C_mF_{2m+1}$ containing a total of 3 to 5 carbon atoms.

In general, the surfactants of the present invention are prepared by first generating an anion from the appropriate fluorochemical of a sulfonamide and a polar solvent. The fluorochemical sulfonamides may be prepared as described in U.S. Pat. No. 3,702,504. The sulfonamide salt may be generated by reacting a compound of the formula $R_f—SO_2NRH$ with a strong base to form a nitrogen-centered anion of the formula $R_f—SO_2N^-R$. The anion is then further reacted with an electrophile containing either a sulfonate or carboxylate group of the formula: electrophile-$R^1—X^-$ resulting in the surfactants of the invention. Further details regarding the preparation of these surfactant compounds of the present invention may be made with reference to the examples.

Solvent

The solvent of the present invention is water, a polar organic solvent, or a mixture thereof. A polar solvent is defined herein as having a dielectric constant greater than 5 at room temperature. Examples of suitable polar organic solvents include, but are not limited to, esters such as methyl formate, ethyl formate, methyl acetate, dimethyl carbonate, diethyl carbonate, propylene carbonate, ethylene carbonate, and butyrolactones (e.g., gamma butyrolactone); nitriles such as acetonitrile and benzonitrile; nitro compounds such as nitromethane or nitrobenzene; amides such as N,N-dimethylformamide, N,N-diethylformamide, and N-methylpyrrolidinone; sulfoxides such as dimethyl sulfoxide; sulfones such as dimethylsulfone, tetramethylene sulfone, and other sulfolanes; oxazolidinones such as N-methyl-2-oxazolidinone and mixtures thereof.

A particularly suitable solvent is water, and in particular de-ionized water. A preferred polar organic solvent is acetonitrile Oxidizing Agents and Other Additives Oxidizing agents include, but are not limited to, for example, $HNO_3$, $H_2O_2$, $O_3$, $Fe(N)_3)_3$, and the like. Additional optional additives may include, for example, abrasive particles, acids (e.g., H2SO4, dilute aqueous HF, HQ), corrosion inhibitors (e.g., benzotriazoles, tolyltriazole (TTA)), chelating agents (e.g., ammonium citrate, iminodiacetic acid (IDA), EDTA), electrolytes (e.g., ammonium hydrogen phosphate), other surfactants, brighteners, levelers, etc. Typically the oxidizing agents are additives present in a concentration ranging from 10 to 100,000 ppm.

For polishing applications, typically the compositions of the present invention either comprise abrasive particles or are used in combination with a fixed abrasive. Suitable abrasive particles include, but are not limited to, alumina, silica, and/or cerium oxide. Generally abrasive particles are present in a concentration ranging from about 3 to about 10 wt. %. Fixed abrasives typically are abrasive particles fixed in a polymer.

For ECMD applications, the compositions of the present invention further comprise a copper salt, which may be any copper salt that is soluble in the solvent (i.e., typically the concentration of the copper cation is at least 0.10 M in the solvent). Suitable copper salts include, but are not limited to, copper imides, copper methides, copper organo-sulfonates, copper sulfates, or mixtures thereof Copper salts are typically present in a concentration ranging from about 0.10 M to about 1.5 M in the solvent.

Method for Preparing the Compositions

The compositions of the present invention may be prepared by at least partially dissolving or dispersing the amide salt surfactant in solvent, preferably de-ionized water.

The surfactant is generally employed at a concentration such that the rate of etching or cleaning can be readily controlled.

Methods

The compositions of the present invention are particularly useful for cleaning a substrate, e.g., silicon wafers and/or cleaning metal interconnects and/or film. Examples of polishing include, but are not limited to, chemical mechanical polishing (CMP), chemical enhanced polishing (CEP), and electrochemical mechanical deposition (ECMD). Examples of cleaning include, but are not limited to, wafer cleaning.

The present invention provides a method of cleaning a substrate comprising tire steps of: (a) providing a composition containing: (i) at least 10 ppm of at least one surfactant of the formula

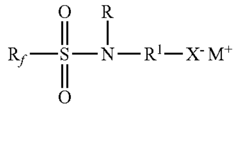

wherein: $R_f$ is a $C_2$ to $C_6$ perfluoroalkyl group; R is a $C_2$-$C_{25}$ alkyl, hydroxyalkyl or aminoalkyl group which is optionally interrupted by a catenary oxygen, nitrogen or sulfur atom; $R^1$ is an alkylene group of the formula $—C_nH_{2n}(CHOH)_oC_mH_{2m}—$, wherein n and m are independently 1 to 6, and o is 0 or 1, and where the alkylene is optionally interrupted by a catenary oxygen, nitrogen, or sulfur atom; $X^-$ is $SO_3^-$ or $—CO_2^-$, and $M^+$ is a cation; (ii) a solvent; and (iii) an oxidizing agent; (b) providing a substrate comprising at least one surface having at least one metal interconnect and/or film, the metal interconnect and/or film having at least one unwanted material on the surface; (c) bringing the surface of the substrate and the composition into contact with each other to form an interface; and (d) allowing removal of unwanted surface material.

This method may further comprise the step of applying a force to promote copper dissolution at the interface when the metal is copper.

Optionally, one or more additives may be added to the composition.

The unwanted materials include, but are not limited to, residues, films, and contaminants including metal oxides.

Suitable substrates of the present invention include, but are not limited to, a silicon or GaAs wafer coated with thin films of various compositions including metals, conductive polymers, and insulating materials.

The copper-containing substrate and the composition typically are brought into contact by immersion, spray, or spin dispense.

Compositions of this invention, containing a carboxylate salt of a fluorinated sulfonamide surfactant as defined above, an acid such as hydrogen fluoride and onium fluoride complex are useful in the various etch operations performed on substrates such as those that may be required for operations in the manufacture of semiconductors. As used herein "substrate" will refer to waters and chips used in microelectronic manufacture, including silicon, germanium, GaAs, InP and other III-V and II-VI compound semiconductors. The compositions can effectively convert hydrophilic silicon oxides to soluble or volatile silicon fluorides.

Other substrates, such as metals may also be etched by appropriate selection of the acid. The fluorinated surfactant effectively reduces the surface tension of the aqueous acid, allowing effective wetting of the substrate.

The etch composition and method of this invention can offer enhanced wetting, which is especially important in small geometry patterns and for features with large aspect ratios, reduced particulate contamination, and reduced surface roughness all of which may lead to improvements in manufacturing efficiency by lowering defects to increase wafer yield, by decreasing cleaning times to increase wafer production or by allowing for longer etch bath life by reducing filtration losses of surfactant.

The improved performance is due in part to the low surface tension of the etch solution due to the fluorinated surfactants used, which contributes to the improved wetting of the surfaces. The surface tensions of the etch solutions are generally less than 50 dynes/cm, preferably less than 23 dynes/cm and most preferably between 15 and 20 dynes/cm when measured at 25° C.

The etch solution may be prepared by combining, in any order, the aqueous acid and the fluorinated surfactant. Preferably the etch solution comprises hydrogen fluoride and an onium fluoride complex. For oxidized silicon substrates, concentration of hydrogen fluoride may vary widely, i.e. from 0.1 to 49 wt. %, depending on the substrate and the etch rate desired. Generally, the concentration of HF is form about 0.1 to 10 wt. %. If an onium fluoride complex, such as ammonium fluoride, is substituted for all or part of the HF, the amount of the onium fluoride may be determined by the HF acid equivalent.

The invention provides a process for etching a substrate by contacting the substrate with the etch solution of the invention for a time and at a temperature sufficient to effect the desired degree of etching. Preferably, the substrate is an oxidized silicon substrate and the etch solution is a buffered oxide etch solution as described herein. Normally an oxidized silicon substrate is etched at 15 to 40° C. If desired, the etch process may further comprise the step of rinsing the etch solution from the etched substrate. In one embodiment, the solution may be rinsed with water, and preferably deionized water. In another embodiment, the etch solution is slowly replaced with deionized water in a gradient etch process.

If desired, the etch solution may further include a second surfactant, in addition to the above described surfactant of the invention. Such second surfactants include both fluorinated and non-fluorinated surfactants such as are known in the etching art. Reference may be made to Kikuyama et al., IEEE Transactions on Semiconductor Manufacturing, Vol. 3, 1990, pp 99-108. Generally, the second surfactant may comprise 0 to 80 weight % of the total surfactant; the total amount of first and second surfactants comprising 10 to 1000 parts per million.

The surfactant is used in amounts sufficient to reduce the surface tension of the solution to the desired degree. For wet etching of silicon substrates, the surfactant is generally used, in amounts sufficient to reduce the surface tension of the resulting solution to 50 dynes/cm or less, preferably 23 dynes/cm or less. Generally the solution contains 10 to 1000 parts per million of surfactant, and is preferably 100 to 500 parts per million. Below 10 parts per million the solution may not exhibit the desirable reduced surface tension and large contact angle on silicon substrate. Above 1000 parts per million, there is little improvement in the properties of the solution or the performance in etching.

Other substrates may also be etched by appropriate selection of the acid or acid mixture. Gold, indium, molybdenum, platinum and nichrome substrates may be etched with a mixture of hydrochloric and nitric acids. Aluminum substrates may be etched with a mixture of phosphoric and nitric acids, and may optionally include acetic acid as a buffer. Silicon substrates may be etched with a mixture of hydrofluoric, nitric and acetic acids. In general, the fluorinated surfactant is used in amounts described for the buffered oxide etch previously described. A SIRTL etch solution may be prepared using a mixture of chromium trioxide and hydrofluoric acid to determine defects in single crystal silicon.

The objects, features and advantages of the present invention are further illustrated by the following examples without being limited to the particular materials and accounts recited as well as other conditions and details. All materials are commercially available or known to those skilled in the art unless otherwise stated or apparent.

EXAMPLES

All parts, percentages, and ratios are by weight unless otherwise specified.

Test Methods

Test Procedure I—Surface Tension Determination

All surface tensions were determined using a Kruss K12 Tensiometer. Tire program was run using a Wilhelmy platinum plate (PL12) and glass sample vessel. All parts referenced above are available from Kruss USA, Charlotte, N.C.

GLOSSARY

| Descriptor | Description/Structure and or Formula |
|---|---|
| CHPS | 3-chloro-2-hydroxy-1-propanesulfonate sodium salt; $ClCH_2CH(OH)CH_2SO_3Na \cdot H_2O$ |
| Diglyme | bis(2-methoxyethyl) ether; $(CH_3OCH_2CH_2)_2O$ |
| Ethyl bromoacetate | $BrCH_2COOC_2H_5$ |
| Hexane | $CH_3(CH_2)_4CH_3$ |
| hexylamine | $CH_3(CH_2)_5NH_2$ |
| MTBE | methyl-t-butyl ether; $CH_3OC(CH_3)_3$ |
| n-octylamine | $CH_3(CH_2)_7NH_2$ |
| triethylamine | $N(C_2H_5)_3$ |
| PBSF | perfluorobutanesulfonyl fluoride; $C_4F_9SO_2F$ |
| 1,4-butane sultone | 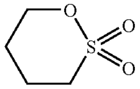 |
| 1,3-propane sultone | 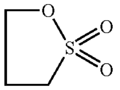 |
| triethyl amine | $N(C_2H_5)_3$ |

All materials listed in the glossary are available from Sigma-Aldrich, Milwaukee, Wis.

$C_4F_9SO_2NH(CH_2)_3N(CH_3)_2$ can be prepared essentially according to U.S. Pat. No. 5,085,786 (Alm et al.) replacing $C_6F_{13}SO_2F$ with $C_4F_9SO_2F$.

$C_4F_9SO_2NH(C_2H_5)$ can be prepared essentially according to WO 01/30873 A1, Example 1A, replacing $NH_2CH_3$ with an equimolar amount of $NH_2C_2H_5$.

Preparation of $C_4F_9SO_2NH_2$

A 3-necked round bottom flask fitted with a cold finger condenser (−78° C.), an overhead stirrer, thermocouple and a plastic tube for gas addition was charged with perfluorobutanesulfonyl fluoride (PBSF; 500.0 g; 1.6 moles; available from Sigma-Aldrich Company) and isopropyl ether (600 mL; available from Sigma-Aldrich) and placed in a bath of room temperature water. Ammonia gas (90.0 g; 5.3 mole) was added over a period of 3 hours. The final temperature of the mixture was 13° C.

The mixture was allowed to stir overnight with warming to room temperature, then the solvent was distilled at atmospheric pressure. When the pot temperature reached 95° C., the temperature setpoint was lowered to 74° C. and deionized water added (400 mL) followed by sulfuric acid (100 g cone; 95%) at a rate to maintain the temperature below 85° C. The batch was stirred for about 15 minutes then the upper aqueous phase was removed. The resulting solid was washed with aqueous sulfuric acid (50.0 g; cone; 95% in 400 mL water), then with deionized water (500 mL).

The mixture was heated and solvent removed under vacuum with water flowing through the condenser until the batch temperature reached 75° C. The solid was isolated by distillation at 12 torr and temperature of 120° C. to 160° C. 454 g of white to creme colored solid, $C_4F_9SO_2NH_2$ (96% yield) was obtained.

Preparation $C_4F_9SO_2NH(C_2H_4OH)$

A 5 L round bottom flask equipped with an overhead stirrer, thermocouple, and reflux condenser was charged with $C_4F_9SO_2NH_2$ (2000 g; 6.69 moles), ethylene carbonate (245 g; 2.78 moles), and sodium carbonate (48.5 g; 0.45 moles; $Na_2CO_3$). The mixture was heated, with stirring, at 120° C. for one hour. At this time more ethylene carbonate (154 g; 1.75 moles) was added and the mixture was heated for an additional 1.5 hours. After additional ethylene carbonate (154 g; 1.75 moles) was added the batch was then heated for an additional 4.5 hours.

The mixture was cooled to 89° C., and deionized water (1000 mL) was added, followed by sulfuric, acid (56 g; concentrated). The batch was agitated for 30 minutes and stirring was discontinued, allowing separation into two phases. The upper aqueous phase layer was removed by vacuum aspiration and deionized water (1000 mL) was added to the remaining organic layer and the mixtures was stirred at 89° C. for an additional 30 minutes. The reaction mixture was poured into a separator/funnel and the lower organic phase was separated from the upper aqueous phase to yield 2163 g of crude $C_4F_9SO_2NH(C_2H_4OH)$.

GC analysis indicated that the crude material contained 66% of the desired material. Crude $C_4F_9SO_2NH(C_2H_4OH)$ was placed in a three-liter flask equipped with an overhead stirrer, thermocouple, vacuum gauge, and a six plate sieve tray distillation column along with associated distillation head and receiver. Water was removed under reduced pressure until the pot temperature reached 87° C. (@ 29 mm Hg), followed by fractional distillation. High purity $C_4F_9SO_2NH(C_2H_4OH)$ (greater than 95% gc assay) was collected at head temperatures of 120-134° C., pot temperatures of 156-170° C., and vacuum of 4-9 mm Hg; A total of 1075 g was isolated (correcting for % conversion, the percent yield was 74%).

Preparation of $C_4F_9SO_2NHC_3H_7$

A 3-necked round bottom flask fitted with a condenser, an overhead stirrer, thermocouple and an addition funnel was charged with PBSF (100.0 g; 0.33 moles), n-propyl amine (40.0 g; 0.678 mole) was added at a rate such that the temperature did not exceed 55° C. over a period of 30 minutes. The mixture was refluxed as 72° C. for 2 hours. Deionized water (300 mL) was then added, maintaining the temperature above 60° C. The batch was stirred for about 15 minutes, then the upper aqueous phase was removed. The resulting solids were washed with sulfuric acid solution (300 mL; 5%), then with deionized water (300 mL). A viscous yellow liquid was isolated and characterized as $C_4F_9SO_2NHC_3H_7$ (99.0 g).

Preparation of $C_4F_9SO_2NHC_4H_9$

The preparation of $C_4F_9SO_2NHC_4H_9$ essentially follows the procedure described for the Preparation of $C_4F_9SO_2NHC_3H_7$ with the exception that an equimolar amount of n-butyl amine was substituted for n-propyl amine.

Preparation of $C_4F_9SO_2NHC_6H_{13}$

A 2 liter flask fitted with a thermocouple, overhead stirrer, dropping funnel and heating mantle was charged with PBSF (543 g; 1.80 mole). To this stirred material was slowly added a mixture of hexylamine (194.0 g; 1.90 mole) and triethylamine (194.0 g; 1.90 mole); the ensuing mixture was stirred and heated at 65° C. for 2 hours. Water (555.0 g) was then added, and stirred for an additional 30 minutes. The lower phase was separated, put into a flask and heated to 60° C. To this heated mixture was added sulfuric acid (50 g concentrated sulfuric and 500 g water). The lower phase of the resulting two-phase mixture was then separated, washed with water (500 g.) and placed in a flask with a one-plate distillation head. The flask was heated to 80° C. at 20-25 mm Hg and the distillate collected over a period of one hour. The material that remained in the flask was further distilled at 8 mm Hg and a pot temperature of 138-143° C., yielding $C_4F_9SO_2NHC_6H_{13}$ (561.0 g; 82% yield). NMR and GC/MS was consistent for the desired material.

Preparation of FC-1: $C_4F_9SO_2N(C_3H_7)CH_2CH_2CH_2COOK$

A one-liter flask fitted with a thermocouple, overhead stirrer and heating mantle was charged with $C_4F_9SO_2NH(C_3H_7)$ (56.0 g; 0.164 mole), $K_2CO_3$ (24.8 g; 0.179 mole; powder), NaClOAc (24.8 g; 0.182 mole) and diglyme (8.0 g). The ensuing mixture was heated at 140° C. for 18 hours. The flask was cooled to 100 deg C. and deionized water (200 mL) was added. The batch was further cooled to room temperature, the lower phase was separated and washed with deionized water (200 mL). A yellow oil, ($C_4F_9SO_2N(C_3H_7)CH_2CH_2CH_2COOCH_3$; 65.0 g) was isolated.

A round bottom flask fitted with a heating mantle and an overhead stirrer was charged with $C_4F_9SO_2N(C_3H_7)CH_2CH_2CH_2COOCH_3$ (63.0 g; 0.143 mole), KOH (11.0 g; 0.196 mole; pellets) isopropanol (22 ml.) and deionized water (18 mL). The ensuing mixture was refluxed overnight, cooled to room temperature, yielding a solution of $C_4F_9SO_2N(C_3H_7)CH_2CH_2CH_2COOK$ (108.6 g; 53.4% solids).

Preparation of FC-2; $C_4F_9SO_2N(C_3H_7)_5COOK$

A one-liter flask fitted with an overhead stirrer, thermocouple and heat mantle was charged with $C_4F_9SO_2NH(C_3H_7)$ (61.0 g; 0.179 mole), KCO3 (32.3 g; 0.232 mole; powder), $Br(CH_2)_5COOC_2H_5$ (52.0 g; 0.234 mole) and diglyme (50.0 g). The ensuing mixture was heated at 140° C. for 18 hours. The flask was then cooled to 100° C. and deionized water (300 mL) was added. The batch was further cooled to room temperature, the lower phase was separated and washed with deionized water (300 mL). A yellow oil, ($C_4F_9SO_2N(C_3H_7)(CH_2)_5COOC_2H_5$; 90.0 g) was isolated.

A round bottom flask fitted with an overhead stirrer was charged with $C_4F_9SO_2N(C_3H_7)(CH_2)_5COOC_2H_5$ (63.0 g; 0.143 mole), KOH (13.1 g; 0.234 mole; pellets) isopropanol (26 mL) and deionized water (21 mL). The ensuing mixture was refluxed overnight, cooled to room temperature, yielding a solution of $C_4F_9SO_2N(C_3H_7)(CH_2)_5COOK$ (61.3% solids).

Preparation of FC-3; $C_4F_9SO_2N(C_3H_7)CH_2COONa$

A one-liter flask, fitted with a thermocouple, heating mantle and overhead stirrer was charged with $C_4F_9SO_2NH(C_3H_7)$ (104.0 g; 0.301 mole), NaOH (12.5 g; 0.32 mole; pellets), and deionized water (104.0 mL), The ensuing mixture was heated at 98° C. for 5 hours. To this mixture was added NaClOAc (41.6 g; 0.357 mole) and KI (3.0 g; 0.018 mole) and the temperature was then increased to 100° C. for 5 hours. Upon cooling to room temperature, two phases formed and the lower phase was isolated, heated to 100° C., and washed with deionized water (100 mL). Upon cooling, the pale yellow solid was isolated and identified, by LC/MS, as a mixture of $C_4F_9SO_2N(C_3H_7)CH_2COONa$ (41%) and $C_4F_9SO_2NH(C_3H_7)$ (57%).

Preparation of FC-4; C4F9SO2N(C2H5)CH2COONa

A one-liter flask fitted with a thermocouple, heating mantle and overhead stirrer was charged with $C_4F_9SO_2NH(C_3H_7)$ (52.3 g; 0.066 mole), NaOH (3.1 g; 0.07 mole; pellets), and deionized water (22.0 mL). The ensuing mixture was heated at 98° C. for 5 hours. To this mixture was added ClOAcNa (9.1 g; 0.078 mole) and the temperature was then increased to 100° C. and held for 18 hours. Upon cooling to room temperature the mixture was filtered, the recovered white solid was oven dried to yield and, white solid/gel precipitated two phases formed and the lower phase was isolated, heated to 100° C., and washed with deionized water (100 mL). Upon cooling the white solid was isolated and identified, using LC/MS, as a mixture of $C_4F_9SO_2N(C_2H_5)CH_2COONa$ (52%) and $C_4F_9SO_2NH(C_2H_5)$ (35%).

Preparation of FC-5; $C_4F_9SO_2N(C_6H_{13})CH_2CH(OH)CH_2SO_3NH_4$

A one-liter flask, fitted with a heating mantle and overhead stirrer was charged with $C_4F_9SO_2NH(C_6H_{13})$ (71.0 g; 0.198 mole), KOH (8.2 g; 0.458 mole; 48%), and deionized water (100.0 mL). The ensuing mixture was heated at 98° C. for 45 minutes. The mixture was cooled to 76° C., CHPS (89.6 g; 0.458 mole) was added and the temperature was then increased to 100° C. and held for 18 hours. After that, water (750 g.) was added to the mixture and the mixture was allowed to cooled to 17° C., and the lower phase was isolated. To this phase was added water (290 g.) and sulfuric acid (289 g.; cone). After the addition of the sulfuric acid, water (140 mL) was added and the ensuing mixture was heated to 86° C. for 30 min. The mixture was then cooled to 30° C. and MTBE (706 g.) was added. The ether phase was separated and twice washed with aliquots of sulfuric acid (30 g cone in 300 mL water). The resulting ether phase was neutralized with $NH_4OH$ (55.6 g; 28% aqueous) and dried to yield $C_4F_9SO_2N(C_6H_{13})CH_2CH(OH)CH_2SO_3NH_4$ (206.0 g).

Preparation of FC-6; $C_4F_9SO_3N(CH_2CH_2OCH_3)CH_2COONa$

A one-liter flask fitted with a thermocouple, heating mantle and overhead stirrer was charged with $C_4F_9SO_2NH$(CH2CH2OCH3) (52.3 g; 0.144 mole), NaOH (6.0 g; 0.15 mole; pellets), and deionized water (50.0 mL). The ensuing mixture was heated at 98° C. for 5 hours. To this mixture was added ClOAcNa (20.0 g; 0.172 mole) and KI (1.0 g; 0.006 mole) and the temperature was then increased to 100° C. and held for 18 hours. Upon cooling to 70° C. two phases formed. The lower phase was isolated and washed with deionized water (50 mL). Upon cooling to room temperature a pale yellow solid formed which was analyzed, using LC/MS, as a mixture of $C_4F_9SO_2N(CH_2CH_2OCH_3)CH_2COONa$ (38%) and $C_4F_9SO_2NH(CH_2CH_2OCH_3)$ (48%).

Preparation of FC-7; $C_4F_9SO_2N(CH_3)CH_2COONa$

A one-liter flask fitted with a thermocouple, heating mantle and overhead stirrer was charged with $C_4F_9SO_2NH(CH_3)$ (53.0 g; 0.168 mole), NaOH (7.8 g; 0.195 mole; pellets), and deionized water (50.0 mL). The ensuing mixture was heated at 98° C. for 5 hours. To this mixture was added NaClOAc (23.0 g; 0.197 mole) and the temperature was then increased to 100° C. and held for 18 hours. Upon cooling to room temperature a white solid precipitated. The mixture was filtered and the recovered white solid was oven dried, yielding $C_4F_9SO_2N(CH_3)CH_2COONa$ (50.0 g).

Preparation of FC-8; $C_4F_9SO_2N(CH_3)CH_2CH(OH)CH_2SO_3Na$

A one-liter flask fitted with a thermocouple, heat mantle and overhead stirrer was charged with $C_4F_9SO_2NH(CH_3)$ (90.8 g; 0.29 mole), CHPS (62.5 g 0.32 mole), NaOH (12.5 g; 0.30 mole; pellets), and deionized water (100.0 mL). The ensuing mixture was heated at 95° C. overnight. Upon cooling to room temperature a white solid precipitated. The mixture was filtered and the recovered white solid was oven dried, yielding $C_4F_9SO_2N(CH_3)CH_2CH(OH)CH_2SO_3Na$ (111.0 g; 81% yield).

Preparation of FC-9; $C_4F_9SO_2N(Et)CH_2CH(OH)CH_2SO_3Na$

A one-liter flask fitted with a thermocouple, reflux condenser, heating mantle and overhead stirrer was charged with $C_4F_9SO_2NH(C_2H_5)$ (92.0 g; 0.28 mole), NaOH (14.0 g; 0.30 mole; pellets), and deionized water (90.0 mL). The ensuing mixture was heated at 98° C. for 5 hours. The temperature of the mixture was then reduced to 76° C. and CHPS (69.0g;

0.35 mole) and deionized water (20 mL) were added. The temperature of the mixture was then increased to 100° C. for 18 hours. After this, deionized water was slowly added (150 mL) and the mixture was allowed to cool to 30° C., upon which a white precipitate formed. The liquid was then decanted from the white solid and deionized water (250 mL) was added to the solid, and the temperature was elevated to 50° C., dissolving the white solid. Upon cooling to room temperature a white solid precipitated, which was filtered, washed with two aliquots of deionized water (150 mL each) and dried. Diazotized derivative of the white solid was analyzed by nmr and GC/MS and results were consistent with the formula $C_4F_9SO_2N(Et)CH_2CH(OH)CH_2SO_3Na$ (119.0 g; 88% yield).

Preparation of FC-10; $C_4F_9SO_2N(Pr)CH_2CH(OH)CH_2S)_3Na$

A one-liter flask fitted with a thermocouple, reflux condenser, heating mantle and overhead stirrer was charged with $C_4F_9SO_2NH(C_3H_7)$ (93.6 g; 0.274 mole), NaOH (13.6 g; 0.34 mole; pellets), and deionized water (90.0 mL). The ensuing mixture was heated at 98° C. for 45 minutes. The temperature of the mixture was then reduced to 76° C. and CHPS (67.9 g; 0.344 mole) was added. The temperature of the mixture was then increased to 100° C. for 18 hours. After this, deionized water (250 mL) was slowly added, and the mixture was allowed to cool to 30° C., upon which two phases were present; and oily yellow phase and water The water was decanted from the oily phase and deionized water (250 mL) was added to the yellow oil. The ensuing mixture was then heating to 50° C., dissolving the oil, and cooled to 19° C. Evaporation of the water from the mixture yielded a creme colored solid which analyzed as $C_4F_9SO_2N(Pr)CH_2CH(OH)CH_2SO_3Na$ (111.4 g; 81% yield).

Preparation of FC-11; $C_4F_9SO_2N(C_2H_5)C_3H_6SO_3Li$

A 500 mL round bottom flask equipped with a condenser, heating mantle and stirrer was charged with $C_4F_9SO_2NH(C_2H_5)$ (15.0 g, 0.0458 moles), LiOH—$H_2O$ (2.1 g; 0.05 moles) and MTBE (100 mL). The ensuing mixture was heated at reflux temperature, with stirring, for 1.5 hours. After cooling to room temperature, the mixture was filtered. The clear, colorless filtrate was combined with 1,3-propane sultone (6.12 g; 0.05 moles) and heated to about 50° C. for 1.5 hours causing precipitation of a white solid. After cooling to room temperature, the white solid was isolated by filtration of the MTBE suspension by suction through a sintered glass frit and washing of the precipitate with two 150 mL portions of MTBE to remove possible residual soluble starting materials. The solid was dried partially by suction and then further dried in a vacuum oven at 50-60° C., $10^{-2}$ torr for about one hour. A white crystalline solid (13.75 g; 66% yield). The $^1H$ NMR spectrum recorded at 200 MHz in $d_6$-acetone was consistent with the structure of $C_4F_9SO_2N(C_2H_5)C_3H_6SO_3Li$.

Preparation of FC-12; $C_4F_9SO_2N(n\text{-}C_3H_7)C_3H_6SO_3Li$

A 500 mL round bottom flask equipped with a condenser, heating mantle, thermocouple and stirrer was charged with $C_4F_9SO_2NH(n\text{-}C_3H_7)$ (15.635g, 0.04585 moles), LiOH—$H_2O$ (2.104 g; 0.05014 moles) and MTBE (150 mL). The ensuing mixture was refluxed, with stirring for 1.5 hours. Upon cooling to room temperature, the reaction mixture was filtered and the clear, colorless filtrate was combined with 1,3-propane sultone (6.124 g; 0.05014 moles) and heated to about 55° C. for 3.0 hours. Upon cooling the mixture to room temperature, bexanes (150 mL) was added, with stirring, causing a white, gummy, semisolid precipitate to form. From this mixture, the solvent was decanted and Hexanes (150 mL) was added. Agitation for a few days at room temperature caused the product to further crystallize to the point where it could be broken up into a suspension of solid particles. The suspension was filtered by suction and the solid product was washed with two portions of hexane and partially dried by suction. Further drying was accomplished in a vacuum oven at 50° C., $10^{-2}$ Torr overnight. A total of 16.9 g of product (78.6% yield) was recovered as a white, free-flowing powder. LC-MS analysis indicated that this material was 87% $C_4F_9SO_2N(n\text{-}C_3H_7)C_3H_6SO_3^-$, with the bulk of the remainder comprising: $C_4F_9SO_2N(n\text{-}C_3H_7)C_3H_6SO_3C_3H_6SO_3^-$ (9.6%) and $C_4F_9SO_2N(n\text{-}C_3H_7)C_3H_6SO_3C_3H_6SO_3C_3H_6SO_3^-$ (1.6%)

Preparation of FC-13; $C_4F_9SO_2N(n\text{-}C_4H_9)C_3H_6SO_3Li$

The preparation of $C_4F_9SO_2N(n\text{-}C_4H_9)C_3H_6SO_3Li$ essentially follows the procedure describes for the preparation of $C_4F_9SO_2N(n\text{-}C_3H_7)C_3H_6SO_3Li$ with the exception that an equimolar amount of $C_4F_9SO_2NH(n\text{-}C_4H_9)$ was substituted for $C_4F_9SO_2NH(n\text{-}C_3H_7)$.

Preparation of FC-14; $C_4F_9SO_2N(CH_3)C_3H_6SO_3Li$

A 500 mL round bottom flask equipped with a condenser, heating mantle, thermocouple and stirrer was charged with $C_4F_9SO_2NH(Me)$ (14.35 g; 0.04585 moles), LiOH—$H_2O$ (2.104 g; 0.05014 moles) and MTBE (100 mL). The ensuing mixture was refluxed for 1.5 hours. After cooling to room temperature, the reaction mixture was filtered and the clear, colorless filtrate was combined with 1,3-propane sultone (6.12 g; 0.0501 moles) and heated to 50° C. for 1.5 hours, causing a white precipitation to form. After cooling to room temperature, the product was isolated by suction filtration through a sintered glass frit, and washed with two aliquots of MTBE (150 mL each). The solid was dried partially by suction and then further dried in a vacuum oven at 50-60° C., $10^{-2}$ Torr for about 5 hours. $C_4F_9SO_2N(CH_3)C_3H_6SO_3Li$ was recovered as a white powder (19.2 g; 95% yield).

Preparation of FC-15; $C_4F_9SO_2N(C_4H_9)CH_2CO_2H$

A one-liter flask fitted with a thermocouple, addition funnel, heating-mantle, reflux condenser and overhead stirrer was charged with $C_4F_9SO_2NH(C_4H_9)$ (133.0 g; 0.375 mole), and sodium carbonate (33.0 g). The mixture was heated to 93° C. and ethyl bromoacetate (69.0 g; 0.411 mole) was slowly added over a period of 8 hours, and then the ensuing mixture was allowed to stir overnight at 93° C. To this mixture was added water (120.0 mL) and the temperature was 56° C., at which point sulfuric acid (39.0 g; concentrated) at a rate to keep the temperature below 100° C. Two phases formed and the bottom layer was recovered and washed with water (150 mL). This crude material was distilled (110-125° C.; 3.3 mm Hg) to yield $C_4F_9SO_2N(C_4H_9)CH_2CO_2C_2H_5$(107.0 g). A one-liter flask fitted with a thermocouple, addition funnel, heating mantle, reflux condenser and overhead stirrer was charged with $C_4F_9SO_2N(C_4H_9)CH_2CO_2C_2H_5$(103.0 g; 0.241 mole) KOH (18.0 g; 0.273 mole) water (50 mL) and isopropanol (50.0g). The mixture was heated at reflux for 2 hours, and a Dean-Stark trap was added. As isopropanol was removed from the trap, an equivalent amount of water was added to the reaction mixture. When the reaction mixture reached 101° C. water (25 mL) was added and the mixture was cooled to 56° C.; upon addition of sulfuric acid (26.7 g; concentrated) the temperature rose o 78° C. and two phases appeared. The bottom phase was distilled (139-147° C.; 3.6 mm Hg) to yield a creme colored solid, $C_4F_9SO_2N(C_4H_9)CH_2CO_2H$.

Preparation of FC-16; C4F9SO2N(C3H7)CH2CO2H

A one-liter flask fitted with a thermocouple, addition funnel, heating mantle, reflux condenser and overhead stirrer was charged with $C_4F_9SO_2NH(C_3H_7)$ (120.0 g; 0.352 mole), and sodium carbonate (39.0 g). The mixture was heated to 93° C. and ethyl bromoacetate (62.0 g; 0.371 mole) was slowly added over a period of 4 hours, and then the ensuing mixture was allowed to stir overnight at 93° C. To this mixture was added water (120.0 mL) and the temperature was 56° C., at which point sulfuric acid (23.8 g; concentrated) at a rate to keep the temperature below 100° C. Two phases formed and the bottom layer was recovered and washed with water (150 mL). This crude material was distilled (95-121° C.; 4.0 mm Hg) to yield $C_4F_9SO_2N(C_3H_7)CH_2CO_2C_2H_5$(132.0 g). A one-liter flask fitted with a thermocouple, addition funnel, heating mantle, reflux condenser and overhead stirrer was charged with $C_4F_9SO_2N(C_3H_7)CH_2CO_2C_2H_5$(116.0 g; 0.27 mole) KOH (20.0 g; 0.303 mole) water (60 mL) and isopropanol (60.0 g). The mixture was heated at reflux for 2 hours, and a Dean-Stark trap was added. As isopropanol was removed from the trap, an equivalent amount of water was added to the reaction mixture. When the reaction mixture reached 101° C. water (25 mL) was added and the mixture was cooled to 56° C.; upon addition of sulfuric acid (31.0 g; concentrated) the temperature increased to 78° C. and two phases appeared. The bottom phase was separated and distilled (136-42° C.; 4.0-5.4 mm Hg) to yield a white solid, $C_4F_9SO_2N(C_3H_7)CH_2CO_2H$ (71.0 g).

A 4 ounce glass jar was charged with $C_4F_9SO_2N(C_3H_7)CH_2CO_2H$ (2.09 g; 0.0126 mole), water (15.1 g) and $NH_4OH$ (0.8 g; 28% aqueous) and heated to 60° C. The mixture was cooled to room temperature, and appropriate aliquots were diluted to 2000 ppm using the solvents listed in Table 1. Surface tension values (dyne/cm) were determined using the test method described above.

Preparation of FC-17; $C_4F_9SO_2N(C_4H_9)CH_2CH(OH)CH_2SO_3Na$

A 1 liter of flask equipped with an overhead stirrer, thermocouple, reflux condenser, and heating mantle was charged with $C_4F_9SO_2NH(C_4H_9)$ (79.8 g; 0.222 mole), water (80 mL) and NaOH (11.5 g; 0.299 mole; pellets) and heated to 98° C. After 45 minutes the flask was cooled to 76° C. and CHPS (58.8 g; 0.299 mole) was added. Then the temperature of the flask was increased to 100° C. After 18 hours the water (210 mL) was added and the flask was cooled to 35° C. Two phases formed, and the lower thick yellow liquid was separated and treated with water (670 mL), and heated to 60° C. Upon cooling, a solid formed which was filtered and dried to yield $C_4F_9SO_2N(C_4H_9)CH_2CH(OH)SO_3Na$ (76.0 g).

Preparation of FC-18; $C_4F_9SO_2N(C_4H_9)CH_2CH(OH)CH_2SO_3NH_4$

A 1 liter of flask equipped with an overhead stirrer, thermocouple, reflux condenser, and healing mantle was charged with $C_4F_9SO_2N(C_4H_9)CH_2CH(OH)CH_2SO_3Na$ (50.0 g), water (50.0 g) and sulfuric acid (50.0 g; concentrated). Additional water (250.0 g) was then added and the flask temperature was elevated to 86° C. for 30 minutes. Upon cooling to 30° C., methyl-t-butyl ether (217.0 g) was added, and two phases ensued. The upper phase was separated and washed with two aliquots of dilute sulfuric acid (6.2 g concentrated sulfuric in 250 mL water) and neutralized with ammonium hydroxide ($NH_4OH$; 13.0 g 28%; aqueous). The upper phase was isolated and dried to yield $C_4F_9SO_2N(C_4H_9)CH_2CH(OH)CH_2SO_3NH_4$(39.0 g).

Preparation of FC-19; $C_4F_9SO_2N(C_3H_7)CH_2CH(OH)CH_2SO_3NH_4$

The procedure described for Preparation FC-17 was essentially followed with the exception that $C_4F_9SO_2N(C_3H_7)CH_2CH(OH)SO_3Na$ (23.7 g) was substituted for $C_4F_9SO_2N(C_4H_9)CH_2CH(OH)SO_3Na$. The process yielded $C_4F_9SO_2N(C_3H_7)CH_2CH(OH)CH_2SO_3NH_4$ (20.8 g)

Preparation of FC-20; $C_4F_9SO_2N(C_2H_4OH)C_3H_6SO_3Li$

A 500 mL round bottom flask equipped with a condenser, heating mantle and stirrer was charged with $C_4F_9SO_2NH(C_2H_4OH)$ (4.2 g, 0.012 moles; as prepared above), LiOH—$H_2O$ (0.56 g; 0.013 moles) and MTBE (50 mL). The ensuing mixture was heated at reflux temperature, with stirring for 1.5 hours. After cooling to room temperature, the mixture was filtered. The clear, colorless filtrate was combined with 1,3-propane sultone (1.64 g; 0.013 moles) and heated to about 50° C. for 1.5 hours causing precipitation of a while solid. After cooling to room temperature, the white solid was isolated by filtration of the MTBE suspension by suction through a sintered glass frit and washing of the precipitate with two 150 mL portions of MTBE to remove possible residual soluble starting materials. The solid was dried partially by suction and then further dried in a vacuum oven at 50-60° C., $10^{-2}$ torr for about one hour. A white crystalline solid, $C_4F_9SO_2N(C_2H_4OH)C_3H_6SO_3Li$, was obtained (3.39 g; 59% yield).

Preparation of FC-21; $C_4F_9SO_2N(C_2H_4OH)C_4H_8SO_3Li$ $C_4F_9SO_2N(C_2H_4OH)C_4H_8SO_3Li$ was prepared essentially according to the procedure described in Preparation of FC-20 with the exception that the corresponding amounts of the following were used: $C_4F_9SO_2NH(C_2H_4OH)$ (4.2 g; 0.012 moles; as prepared above), LiOH—$H_2O$ (0.565 g; 0.013 moles), MTBE (50 mL), and (75mL), and 1,3-propane sultone was replaced with 1,4-butane sultone (1.83 g; 0.013 moles). Additionally, after evaporating most of MTBE by boiling at atmospheric pressure, DME was added and reflux was resumed at 85° C. for 1 hour resulting in precipitation of a white solid. The white solid, $C_4F_9SO_2N(C_2H_4OH)C_4H_8SO_3Li$, was isolated (1.39 g; 23.5% yield).

Preparation of FC-22; $C_4F_9SO_2N(H)(CH_2)_3N^+(CH_3)_2(CH_2)_3SO_3$

A 500 mL round bottom flask fitted with a condenser, heating mantle and stirrer under nitrogen atmosphere was charged with $C_4F_9SO_2NH(CH_2)_3N(CH_3)_2$ (15.0 g, 0.039 moles), 1,3-propane sultone (5.25 g; 0.042 moles) and MTBE (100 mL) The mixture was held at reflux temperature with stirring for 27 hours. After cooling to room temperature, the insoluble solid white product was isolated by filtration of the MTBE suspension by suction through a sintered glass frit and washing of the precipitate with three 100 mL portions of MTBE. The solid was dried partially by suction and then further dried in a vacuum oven at 50-80° C., $10^{-2}$ Torr for about 45 minutes. A white solid, $C_4F_9SO_2N(H)(CH_2)_3N^+(CH_3)_2(CH_2)_3SO_3^-$, was isolated (18.36 g; 93% yield).

Preparation of FC-23; $C_4F_9SO_2N(C_6H_{13})CH_2COOK$

A 500 mL round bottom flask equipped with an overhead stirrer, therocouple, addition funnel, heating mantle and reflux condenser was charged with $C_4F_9SO_2NH(C_6H_{13})$ (123.0 g; 0.320 mole) and $K_2CO_3$ (38.0 g; 0.275 mole). The ensuing mixture was heated to 93° C. and ethyl bromoacetate (60.0 g; 0.358 mole) was slowly added over 8 hours. The flask was further stirred overnight, and in the morning water (120 mL) was added. The resulting mixture was then heated to 75° C. and concentrated sulfuric acid (39.0 g) was slowly added, so as to keep the temperature below 100° C. Two phases formed. The lower phases was separated from the upper phase (while still at 75° C.), washed with water (150 mL) and crude solid material was isolated from the solvent and dried in vacuum (10 mm Hg) at 116° C. (144.0 g). This crude solid (144.0 g; 0.241 mole) was then placed in a one liter round bottom flask fitted with an overhead stirrer, thermocouple and reflux condenser along with KOH (23.5 g; 0.273 mole), water (65 mL) and isopropanol (65.0 g). The flask was then heated to 100° C. for 2 hours, resulting in an amber solution of $C_4F_9SO_2N(C_6H_{13})CH_2COOK$ (48% by weight solids).

Appropriate amount of additives were mixed to achieve solutions of various concentrations in a variety of solvents (as listed in Table 1). Surface tensions values were determined using the test method described above.

TABLE 1

Surface tensions values (°) determined using Test Procedure 1

| | Surface Tension Values (°) | | | | |
|---|---|---|---|---|---|
| Example | Water (2000 ppm) | KOH 10% (2000 ppm) | HCl 18.5% | $H_2SO_4$ 50% | $H_3PO_4$ |
| FC-1 | 27.30 | 18.7 | | | |
| FC-2 | 22.61 | 18.99 | | | |
| FC-3 | 32.3 | 18.0 | 37.08 | 36.7 | 26.45 |
| FC-4 | 34.05 | 17.91 | 34.10 | 27.84 | 32.44 |
| FC-5 | 19.45 | 18.97 | | | |
| FC-6 | 38.52 | 21.18 | 28.41 | 26.26 | 21.47 |
| FC-7 | 27.00 | 17.30 | | | |
| FC-8 | 34.70 | | — | — | — |
| FC-9 | 30.00 | 19.80 | — | — | — |
| FC-10 | | 21.1 | — | — | — |
| FC-11 | 48.08 | 24.09 | — | — | — |
| FC-12 | 37.97 | 18.98 | — | — | — |
| FC-13 | 31.06 | 19.30 | — | — | — |
| FC-14 | 54.0 | 38.8 | — | — | — |
| FC-15 | 29.08 | 17.97 | | 22.29 | — |
| FC-16 | 38.19 | 18.1 | — | 44.67 | 44.96 |
| FC-17 | | 19.13 | — | — | — |
| FC-18 | | 19.37 | — | — | — |
| FC-19 | | 18.85 | — | — | — |
| FC-20 | 56.18 | 61.62 | — | — | — |
| FC-21 | 56.31 | 31.72 | — | — | — |
| FC-22 | 26.63 | 24.44 | — | — | — |
| FC-23 | 22.19 | 18.98 | | | |
| *C-1 | 72 | 77 | | | |

*Comparative example with no fluorochemicals added

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims as set forth herein as follows.

We claim:

1. An aqueous cleaning solution comprising:

(a) an acid; and (b) a surfactant of the formula:

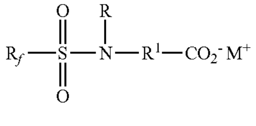

wherein:

$R_f$ is a $C_2$ to $C_6$ perfluoroalkyl group;

R is a $C_2$ to $C_{25}$ alkyl, hydroxyalkyl, an alkylamine oxide or an aminoalkyl group which is optionally interrupted by a catenary oxygen, nitrogen, or sulfur atom;

$R^1$ is an alkylene group of the formula $—C_nH_{2n}(CHOH)_oC_mH_{2m}—$, wherein n and m are independently 1 to 6, and o is 0 or 1, and where the alkylene is optionally interrupted by a catenary oxygen, nitrogen or sulfur atom; and $M^+$ is a cation; and further comprising ammonium hydroxide.

2. A cleaning solution of claim 1 wherein said acid is hydrogen fluoride, an onium fluoride complex, or a mixture thereof.

3. A cleaning solution of claim 1 wherein R is a hydroxyalkyl group of the formula $—C_pH_{2p}—OH$, where p is an integer of 1 to 6.

4. A cleaning solution of claim 1 wherein R is an aminoalkyl group of the formula $—C_pH_{2p}—NR^2R^3$ where p is an integer of 1 to 6 and $R^2$ and $R^3$ are independently H or alkyl of 1 to 6 carbon atoms.

5. A cleaning solution of claim 1 wherein $R^1$ is $—C_nH_{2n}CH(OH)C_mH_{2m}—$, wherein n and m are independently 1 to 6.

6. A cleaning solution of claim 1 wherein said cation is an alkali metal, an alkaline earth metal, a transition metal, or an onium ion.

7. A cleaning solution of claim 6 wherein said onium ion is an ammonium ion.

8. A cleaning solution of claim 1 wherein $R_f$ is a $C_3$ to $C_5$ perfluoroalkyl group.

9. A cleaning solution of claim 1 wherein $R_f$ is a $C_4$ perfluoroalkyl.

10. A cleaning solution of claim 2 wherein said onium fluoride complex is selected from pyridinium poly(hydrogen fluoride), oxonium poly(hydrogen fluoride), ammonium poly (hydrogen fluoride), and phosphonium poly(hydrogen fluoride).

11. A cleaning solution of claim 1 comprising 10 to 1000 parts per million of said surfactant.

12. A cleaning solution of claim 2 comprising 0.1 to 49 weight percent HF or onium fluoride complex thereof.

13. An aqueous cleaning solution comprising at least 10 parts per million of at least one surfactant of the formula:

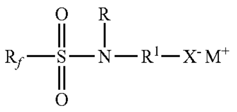

wherein:

$R_f$ is a $C_2$ to $C_6$ perfluoroalkyl group;

R is a $C_2$ to $C_{25}$ alkyl, hydroxyalkyl, alkylamine oxide, or aminoalkyl group which is optionally interrupted by a catenary oxygen, nitrogen or sulfur atom;

$R^1$ is an alkylene group of the formula $—C_n—H_{2n}(CHOH)_oC_mH_{2m}—$, wherein n and m are independently 1 to 6, and o is 0 or 1, and where the alkylene is optionally interrupted by a catenary oxygen, nitrogen, or sulfur atom;

$X^-$ is $SO_3^-$ or $—CO_2^-$; and $M^+$ is a cation; and further comprising ammonium hydroxide, and wherein the solution has a pH of 7 or greater.

14. A cleaning solution of claim 13 wherein R is a hydroxyalkyl group of the formula $—C_pH_2—OH$, where p is an integer of 1 to 6.

15. A cleaning solution of claim 13 wherein R is an aminoalkyl group of the formula $—C_pH_{2p}—NR^2R^3$ where p is an integer of 1 to 6 and $R^2$ and $R^3$ are independently H or alkyl of 1 to 6 carbon atoms.

16. A cleaning solution of claim 13 wherein $R^1$ is $—C_nH_{2n}CH(OH)C_mH_{2m}—$, wherein n and m are independently 1 to 6.

17. A cleaning solution of claim 13 wherein said cation is an alkali metal, an alkaline earth metal, a transition metal, or an onium ion.

18. A cleaning solution of claim 17 wherein said onium ion is an ammonium ion.

19. A cleaning solution of claim 13 wherein $R_f$ is a $C_3$ to $C_5$ perfluoroalkyl group.

20. A cleaning solution of claim 13 wherein $R_f$ is a $C_4$ perfluoroalkyl.

21. A cleaning solution of claim 13 comprising 10 to 1000 parts per million of said surfactant.

* * * * *

UNITED STATES PATENT AND TRADEMARK OFFICE
CERTIFICATE OF CORRECTION

PATENT NO. : 7,985,723 B2
APPLICATION NO. : 12/871275
DATED : July 26, 2011
INVENTOR(S) : Patricia M Savu et al.

It is certified that error appears in the above-identified patent and that said Letters Patent is hereby corrected as shown below:

Column 1,
Line 53, delete "Soc," and insert -- Soc., --.
Line 63, delete "metal," and insert -- metal --.

Column 2.
Line 2, delete "($H_2S)_4$)" and insert -- ($H_2SO_4$) --.

Column 4,
Line 53, delete "in" and insert -- m --.

Column 6,
Line 16, delete "Fe(N$)_3)_3$," and insert -- $Fe(NO_3)_3$, --.
Line 18, delete "HQ)," and insert -- HCl), --.
Line 38, delete "thereof" and insert -- thereof. --.
Line 57, delete "tire" and insert -- the --.

Column 7,
Line 36, delete "waters" and insert -- wafers --.

Column 8,
Line 30, delete "used," and insert -- used --.
Line 67, delete "Tire" and insert -- The --.

Column 9,
Line 56, delete "cone;" and insert -- conc; --.
Line 60, delete "cone;" and insert -- conc; --.

Column 10,
Line 13, delete "sulfuric," and insert -- sulfuric --.

Signed and Sealed this
Seventh Day of February, 2012

David J. Kappos
*Director of the United States Patent and Trademark Office*

Line 20, delete “separator/funnel” and insert -- separatory funnel --.
Line 38, delete “moles),” and insert -- moles). --.

Column 11,
Line 5, delete “FC-1:” and insert -- FC-1; --.
Line 20, delete “ml.)” and insert -- mL) --.
Line 24, delete “$C_4F_9SO_2N(C_3H_7)_5COOK$” and insert -- $C_4F_9SO_2N(C_3H_7)(CH_2)_5COOK$ --.
Line 45, delete “mL),” and insert -- mL). --.
Line 57, delete “$(C_3H_7)$” and insert -- $(C_2H_5)$ --.

Column 12,
Line 15, delete “cone).” and insert -- conc). --.
Line 19, delete “cone” and insert -- conc --.
Line 23, delete “$SO_3$” and insert -- $SO_2$ --.
Line 53, delete “(62.5 g 0.32 mole),” and insert -- (62.5 g; 0.32 mole), --.

Column 13,
Line 16, delete “$S)_3Na$” and insert -- $SO_3Na$ --.
Line 63, delete “bexanes” and insert -- hexanes --.

Column 14,
Line 29, delete “frit,” and insert -- frit --.
Line 36, delete “heating-mantle,” and insert -- heating mantle, --.
Line 47, delete “$H_5$(107.0” and insert -- $H_5$ (107.0 --.
Line 50, delete “$H_5$(103.0” and insert -- $H_5$ (103.0 --.

Column 15,
Line 8, delete “$H_5$(132.0” and insert -- $H_5$ (132.0 --.
Line 11, delete “$H_5$(116.0” and insert -- $H_5$ (116.0 --.
Line 22, delete “(136-42°” and insert -- (136-142° --.
Line 49, delete “healing” and insert -- heating --.

Column 16,
Line 10, delete “while” and insert -- white --.
Line 33, delete “$SO_3$” and insert -- $SO_3^-$ --.